(12) United States Patent
Bringivijayaraghavan et al.

(10) Patent No.: US 7,511,534 B1
(45) Date of Patent: Mar. 31, 2009

(54) CIRCUITS, DEVICES, SYSTEMS, AND METHODS OF OPERATION FOR A LINEAR OUTPUT DRIVER

(75) Inventors: Venkatraghavan Bringivijayaraghavan, Plano, TX (US); Brian Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/973,022

(22) Filed: Oct. 5, 2007

(51) Int. Cl.
*H03K 19/0175* (2006.01)
(52) U.S. Cl. .......................................... 326/87; 326/83
(58) Field of Classification Search .............. 326/82–87
See application file for complete search history.

(56) References Cited

U.S. PATENT DOCUMENTS

| | | | |
|---|---|---|---|
| 5,274,276 A | 12/1993 | Casper et al. ............... 307/443 |
| 5,959,473 A * | 9/1999 | Sakuragi ..................... 327/111 |
| 6,084,434 A | 7/2000 | Keeth ........................... 326/87 |
| 6,141,263 A | 10/2000 | Protzman ............... 365/189.11 |
| 6,377,089 B1 * | 4/2002 | Loughmiller ............... 327/112 |
| 6,509,765 B1 * | 1/2003 | Drost .......................... 327/112 |

* cited by examiner

*Primary Examiner*—Don P Le
(74) *Attorney, Agent, or Firm*—Dorsey & Whitney LLP

(57) ABSTRACT

Embodiments are described for an output driver circuit capable of maintaining a substantially constant output impedance across a wide range of output voltages. The driver circuit includes a pull-up circuit and a pull-down circuit, each having two or more current paths that either source currents to or sink currents from the output node. The addition of the third current path provides additional current such that the sum of the total currents have a magnitude that changes linearly as the output voltage at the output node is being driven.

24 Claims, 8 Drawing Sheets

CIRCUITS, DEVICES, SYSTEMS, AND METHODS OF OPERATION FOR A LINEAR OUTPUT DRIVER

TECHNICAL FIELD

Embodiments of the present invention relate generally to integrated circuit devices, and more specifically, to an output driver having linear characteristics over a wide range of voltages.

BACKGROUND

Integrated circuits, such as those used in semiconductor devices, require input/output (I/O) terminals to couple to an external bus or interface with external circuitry. For example, memory devices, such as dynamic random access memory (DRAM) devices, synchronous dynamic random access memory (SDRAM), reduced latency dynamic random access memory (RLDRAM), and others, transfer data from an array of memory cells to an output terminal, such as a DQ pad. Data may then be placed on a transmission line having a termination to properly transfer data to receiving circuitry external to the memory device, such as a processor or memory controller. In order for the memory device to successful transfer data, the memory device conventionally includes an output driver that is capable of driving data onto the transmission line at drive capabilities required by the external bus or circuitry. Output drivers commonly include a pull-up device, mainly comprising of PMOS transistors, and a pull-down device, comprising of NMOS transistors. The term "pull-up" refers to the device being adapted to pull an output node to a desired logic high voltage level "1", and the term "pull-down" refers to the device being adapted to pull the output node to a desired logic low voltage level "0". The output driver compensates for variations in supply voltage to provide more consistent switching speed characteristics between the logic high and low output signals. Additionally, the transistors in the output driver may be designed to adjust impedances in the respective pull-up and pull-down devices to control the output impedance of the output driver.

FIG. 1 is an example of a prior art complementary metal oxide semiconductor (CMOS) output driver circuit 10 having both a pull-up circuit 11 and a pull-down circuit 12. The pull-up circuit 11 and pull-down circuit 12 are coupled in series with each other between supply voltages $V_{CC}$ and $V_{SS}$, and also coupled to a DQ pad for outputting a DQ signal at an output node 50. The pull-up circuit 11 includes a PMOS output transistor 22 coupled to an active low input PUPF at an input node 20. The input node 20 is further coupled to a PMOS enabling transistor 26 that is coupled in series with a diode-connected PMOS transistor 24. The drains of the transistors 22, 24 are coupled to the output node 50. The drain of the diode-connected transistor 24 is additionally coupled to its gate.

The pull-down device 12 is configured in a similar manner as the pull-up transistor 11, except that each of the PMOS transistors 22, 26, 24 are replaced by NMOS transistors 32, 36, 34 respectively, and are coupled to $V_{SS}$ instead of $V_{CC}$. An active high input signal PDN may be received at a node 30. As explained in greater detail below, the PUPF and PDN signals may be driven to place the DQ pad at a high logic level, a low logic level, or a tristate (high impedance) level.

In operation, to drive the DQ pad high, the PUPF signal is low, and the PDN signal is also low, thus disabling the pull-down circuit 12. The low PUPF signal received by the gate of the transistor 22 at node 20 turns ON the transistor 22, thereby pulls the voltage at the output node 50 towards the supply voltage $V_{CC}$. The gate of the transistor 26 also receives the low PUPF signal, and assuming the DQ voltage is initially low, both the transistor 26 and the diode-connected transistor 24 are turned ON to pull the DQ pad towards $V_{CC}$. The DQ pad will be pulled towards $V_{CC}$ by both devices until it reaches a voltage level that is greater than $V_{CC}$ less the threshold voltage of the diode-connected transistor 24 and subsequently turn OFF the transistor 24.

To drive the DQ pad low, the PUPF signal transitions high to disable the pull-up circuit 11, and the PDN signal also transitions high. The high PDN signal turns ON the transistors 32, 36, and therefore couples the node 50 to $V_{SS}$ through the transistor 32. At the same time, since the voltage of the DQ pad is initially high due to the previous operation of the pull-up circuit 11, the diode-connected transistor 34 is initially turned ON to drain the node 50 towards $V_{SS}$ through the transistor 36. When the DQ pad is pulled down to the threshold voltage of the diode-connected transistor 34, the transistor 34 is disabled, and the DQ pad is pulled down to $V_{SS}$ solely through the transistor 32.

To drive the DQ pad to a tristate condition, the PUPF signal is driven inactive high to disable the pull-up circuit 11, and the PDN signal is driven inactive low to disable the pull-down circuit 12. The PUPF signal should never be active low at the same time that the PDN signal is active high or else the pull-up circuit 11 and the pull-down circuit 12 will both be active and they will couple $V_{CC}$ to $V_{SS}$.

A constant resistance at the output node is conventionally desired for matching the output impedance of the output driver circuit 10 to the external impedance. For example, during the operation of the pull-up circuit 11, the output resistance at the node 50 may be held substantially constant by increasing the current from the DQ pad at a rate that is proportional to the change in the voltage at the DQ pad as the DQ pad charges towards the logic high level. Therefore, the constant output resistance may be met by establishing a linear relationship between the total current and the voltage at the node 50. However, the I-V relationship of the transistors 22, 32 deviate from a linear relationship as the transistors 22, 32 approach saturation because the current through the transistors 22, 32 no longer continues to change as the voltage at the drains of the transistors 22, 32 change. The drain-to-source impedances of the transistors 22, 32 then begin to increase. For this reason, the pull-up circuit 11 uses an extra current path formed by the transistors 24, 26, and the pull-down circuit 12 uses an extra current path formed by the transistors 34, 36. The manner in which these extra current paths make the output impedance more constant will now be explained with reference to FIG. 2.

FIG. 2 is a signal diagram 201 that shows at the lower half of FIG. 2 a first graph 214 of the current through the transistor 32 as a function of voltage at node 50. It can be seen that the current is initially directly proportional to voltage, but deviates from a linear relationship as the transistor 32 becomes saturated. Also shown at the lower half of FIG. 2 is a graph 215 of the current through the transistors 34, 36. Although the transistor 36 is driven with the same PDN signal that drives the transistor 32, the presence of the diode-connected transistor 34 causes the saturation of the transistor 36 to be well beyond the voltage at the DQ pad that causes saturation of the transistor 32. The total current from the DQ pad, i.e., the sum of the current through the first path formed by the transistor 32 and the current through the second path formed by the transistors 34, 36, is shown as the graph 212 at the top of FIG. 2. As shown by the graph 212, the current from the output driver circuit 10 is much more linear compared to the graph 214 showing the current from the transistor 32 alone. The second path formed by the transistors 34, 36 therefore makes the output impedance of the output driver circuit 10 substantially more linear. However, as further shown by the graph 210 in FIG. 2, the output impedance still changes excessively. Graph 210 is a linear curve showing what the current-voltage characteristics would be if the output impedance of the driver circuit 10 were constant, i.e., the current was directly proportional to voltage. The graphs show the actual current deviating from a linear response as the voltage of the DQ pad increases towards $V_{CC}$. This deviation is the result of the diode-connected transistor 34 being unable to provide enough current at higher voltages. Consequently, the output impedance changes as the voltage at the DQ pad approaches the supply voltages $V_{CC}$ and $V_{SS}$.

Changes to the output resistance may cause impedance mismatches between the output driver circuit 10 and transmission lines, and therefore cause the voltage at the DQ pad to become more susceptible to reflection and noise resulting in misinterpreted voltage levels by receiving external circuitry. Furthermore, due to a reduction in current at higher voltages, the size of the transistors 22, 26, 24, 32, 36, 34 may be made larger to reduce the resistance and thereby increase the current. However, with larger transistors the output current deviates from the ideal linear response (indicated by the graph 210 in FIG. 2) sooner at low and mid voltage ranges. Additionally, larger transistors consume more space on the chip, and increase the circuit size that is already large due to the bulky diode-connected transistors. Larger transistors are particularly undesirable in memory devices that require multiple DQ pads, such as an RLDRAM device that conventionally includes at least 36 DQ pads.

There is, therefore, a need in the art for a smaller sized linear output driver that reduces the size of its transistors while still achieving current linearity over a wider range of voltages.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring embodiments of the invention.

Figure 1:
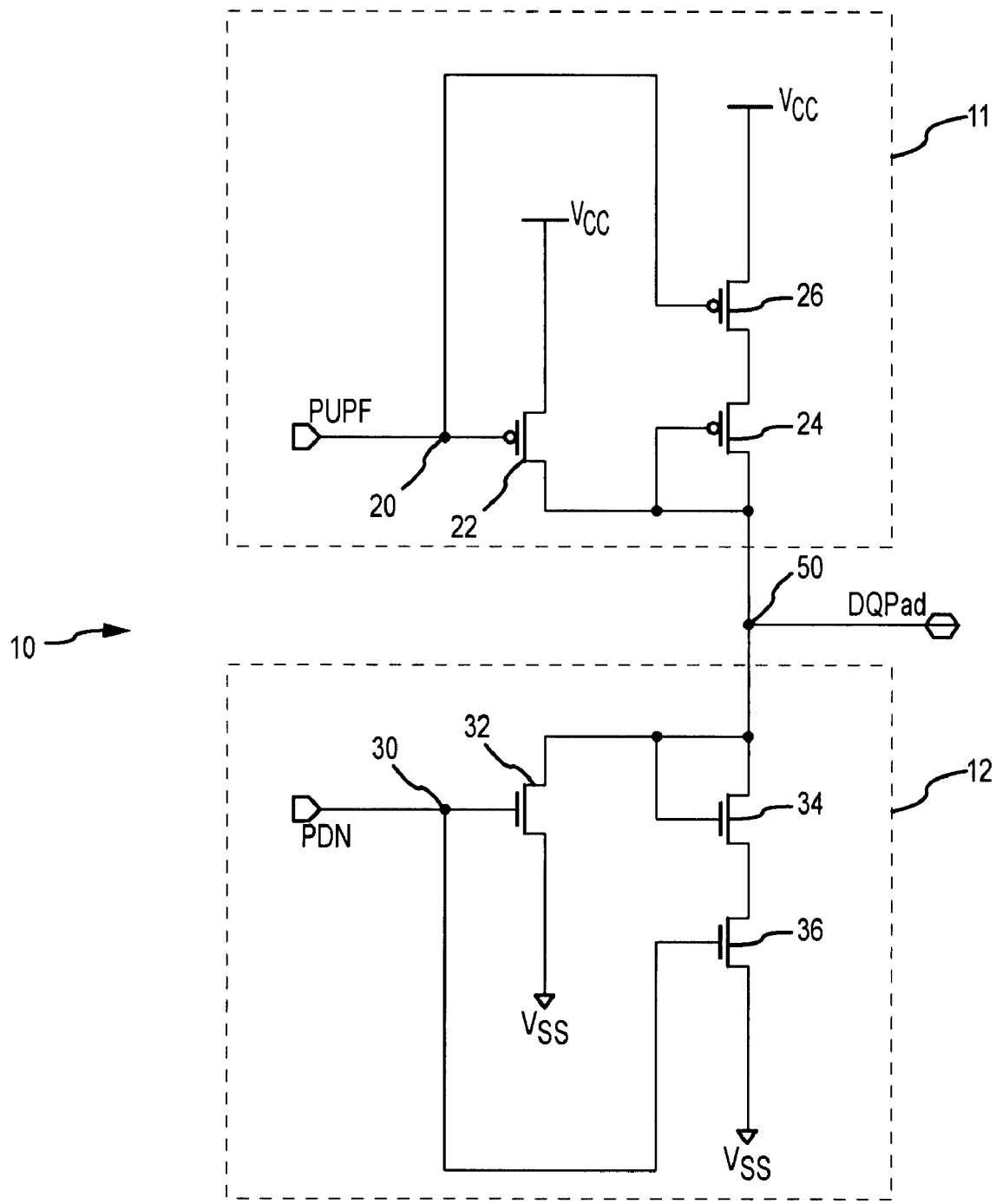
FIG. 1 is a schematic diagram showing a conventional linear output driver circuit.
Figure 3:
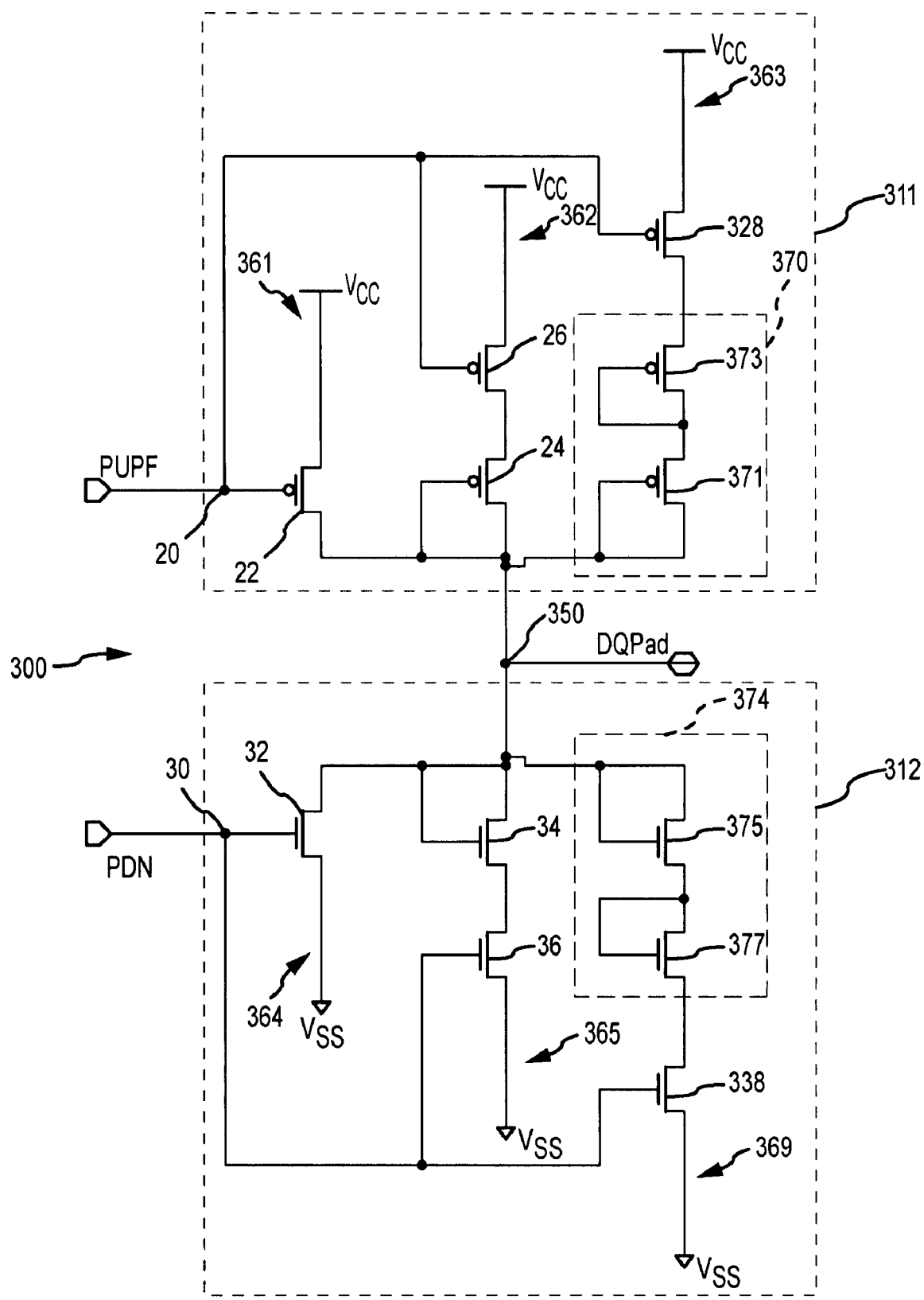
FIG. 3 is a schematic diagram showing a linear output driver according to an embodiment of the invention.

As previously described, more current is needed at the output node for the output driver 10 of FIG. 1 to achieve linearity at higher output voltages, and thereby achieve a substantially constant output impedance. FIG. 3 shows an output driver circuit 300 having additional third transistor legs 363, 369 coupled in parallel to the transistor legs of the output driver circuit 10. Similar to the output driver circuit 10, the output driver circuit 300 includes a pull-up circuit 311 and a pull-down circuit 312. The output driver circuit 300 includes many of the same components as previously described with reference to the output driver circuit 10 of FIG. 1. As such, the same reference numbers used in FIG. 1 are used to refer to the same components in FIG. 3 where appropriate, and in the interest of brevity, their structure and operation are not repeated. The pull-up circuit 311 includes a first leg 361 coupling the output node 350 to $V_{CC}$ through the transistor 22, a second leg 362 coupling the output node 350 to $V_{CC}$ through the transistors 24, 26, and a third leg 363 coupling the output node 350 to $V_{CC}$ by transistors 328, 371, 373. Although only three legs are shown in FIG. 3, it will be appreciated that additional cascoded legs, with each leg having more than four transistors, may be connected in parallel to achieve greater linearity. The third leg 363 includes a cascode diode-connected transistor pair 370, having two PMOS diode-connected transistors 371, 373 coupled in series to each other and in series with a PMOS enabling transistor 328 whose source is coupled to $V_{CC}$.

The output driver circuit 300 is operated similarly to the output driver circuit 10, except that the third transistor leg 363 provides additional current to the output node 350. The PUPF signal may be provided in three phases to allow the transistors 22, 26, 328 to be enabled coincident with respect to each other. For example, the transistor 328 may be turned ON or OFF slightly earlier than the transistor 26, and the transistor 26 may be turned ON or OFF earlier than transistor 22. This allows the current drawn through the DQ pad from the transistor legs 361, 362, 363 to appear more coincident, particularly in the case when the transistors 22, 26, 328 are turned ON. By turning ON the transistor 328, the gate-to-source voltage of the transistor 373 changes such that the transistor 373 is also turned ON. Assuming the voltage at the DQ pad is initially low, the gate-to-source voltages of the respective diode-connected transistors 24, 371 adjust and become greater than the respective threshold voltages responsive to the transistors 328, 373 and the transistor 26 being enabled. Therefore, the transistors 24, 371 are turned on to successively couple $V_{CC}$ to the DQ pad through the transistor legs 362, 363. The $V_{CC}$ voltage may be sufficiently high to cause the first transistor leg 361 to enter into saturation, as previously described, thereby limiting the current through the transistor 22. The third transistor leg 363 may thus provide the current necessary to achieve linearity between the current and drain-to-source voltage of the transistor 22 that was previously not attainable by the second leg 362 at higher voltages. The combined sum of the currents generated across each of the three transistor legs 361, 362, 363 provides a total current to the output node 350 that is proportional to the voltage of the DQ pad as the voltage approaches $V_{CC}$. As a result, a substantially constant output impedance can be maintained at the node 350, independent of the voltage level $V_{CC}$. When the DQ pad is pulled up to a voltage that is greater than $V_{CC}$ less than the threshold voltages of the cascode diode-connected transistors 371, 373, the transistors 371, 373 are turned OFF to disable the third transistor leg 363. The second transistor leg 362 is disabled next and, the DQ pad is then pulled up solely through the first transistor leg 361.

Similar to the pull-up circuit 311, the pull-down circuit 312 couples the output node 350 to $V_{SS}$ through three transistor legs 364, 365, 369, and utilizes NMOS transistors instead of PMOS transistors, that are configured in the same manner as the PMOS transistors of the pull-up circuit 311. The third transistor leg 369 of the pull-down circuit 312 similarly includes the cascode diode-connected transistor pair 374 comprising two NMOS cascode diode-connected transistors 375, 377 coupled in series to each other and in series with an NMOS enabling transistor 338 whose source is coupled to $V_{SS}$. The pull-down circuit 312 operates in a similar manner as the pull-up circuit 311, except that each of the three transistor legs 364-369 are enabled to pull down the DQ pad towards $V_{SS}$. Similarly, as explained above, the first transistor leg 364 may enter into saturation due to the high voltage at the node 350 coupled to the drain of the transistor 32 after the operation of the pull-up circuit 311. Thus, the third transistor leg 369 is capable of draining more current to compensate for the limited current being sourced to $V_{SS}$ by the first leg 364. The PDN signal, in the same manner as the PUPF signal described above, may be provided in three phases to allow the transistors 32, 36, 338 to be enabled coincident with respect to each other. The transistor 338 may be turned ON slightly earlier than the transistor 36, and the transistor 36 turned ON earlier than transistor 32 such that current is successively drawn from the DQ pad through the transistor legs 369, 365, 364, respectively. Therefore, similar to the pull-up circuit 311, the pull-down circuit 312 is capable of achieving linearity across a wider span of voltages to maintain a substantially constant output impedance at the node 350. It will be appreciated that although the embodiment of the output driver circuit 300 is described with respect to each of the pull-up and pull-down circuits 311, 312 having three transistor legs, additional transistor legs may be further added, whereby the addition of more transistor legs is not intended to limit the embodiments of the invention. Those ordinarily skilled in the art will appreciate that the number of transistor legs in the output driver circuit 300 are details that can be modified without departing from the scope of the embodiments of the present invention.

Figure 2:
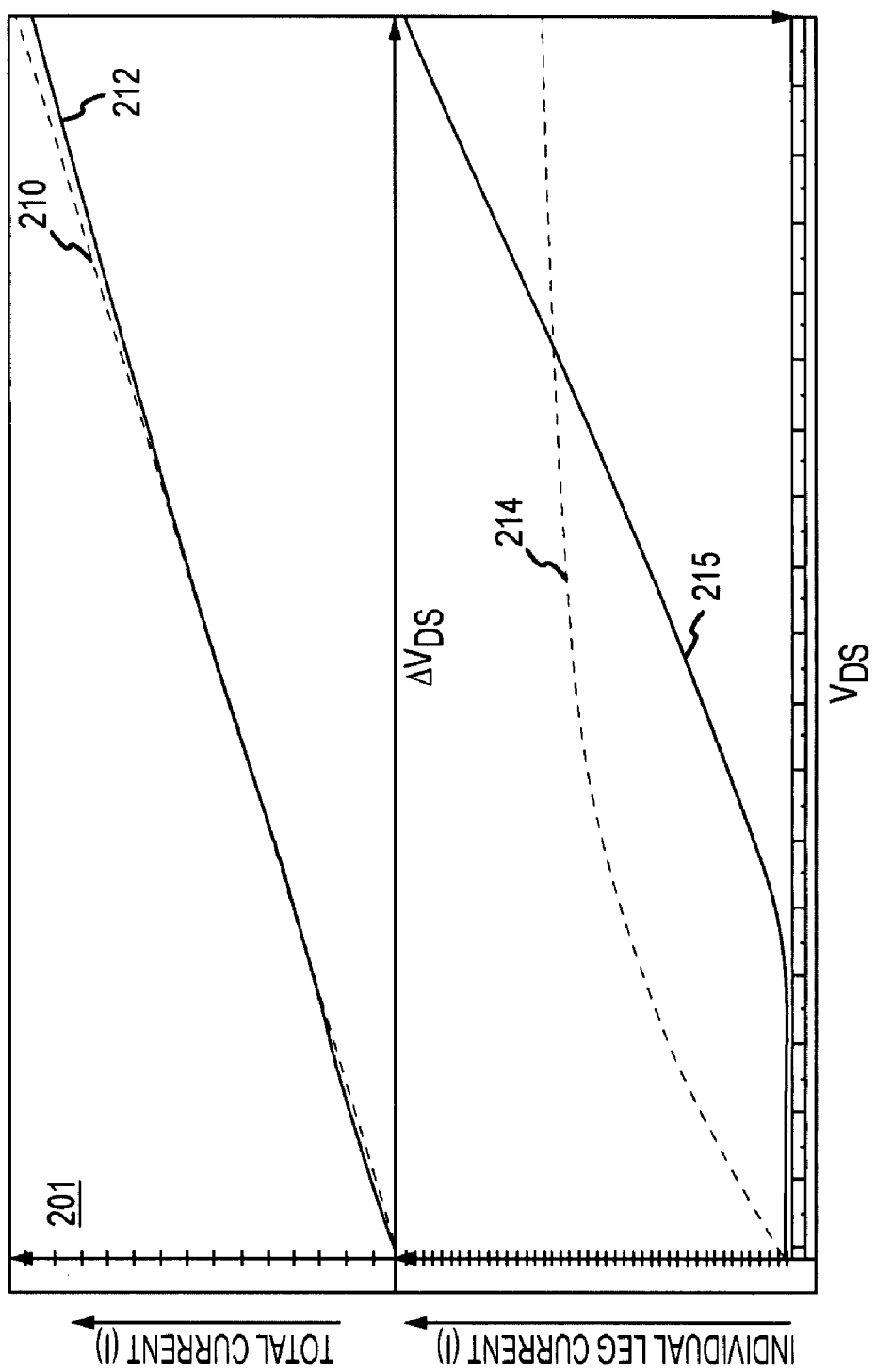
FIG. 2 is a signal diagram of various current signals of the output driver circuit of FIG. 1.
Figure 4:
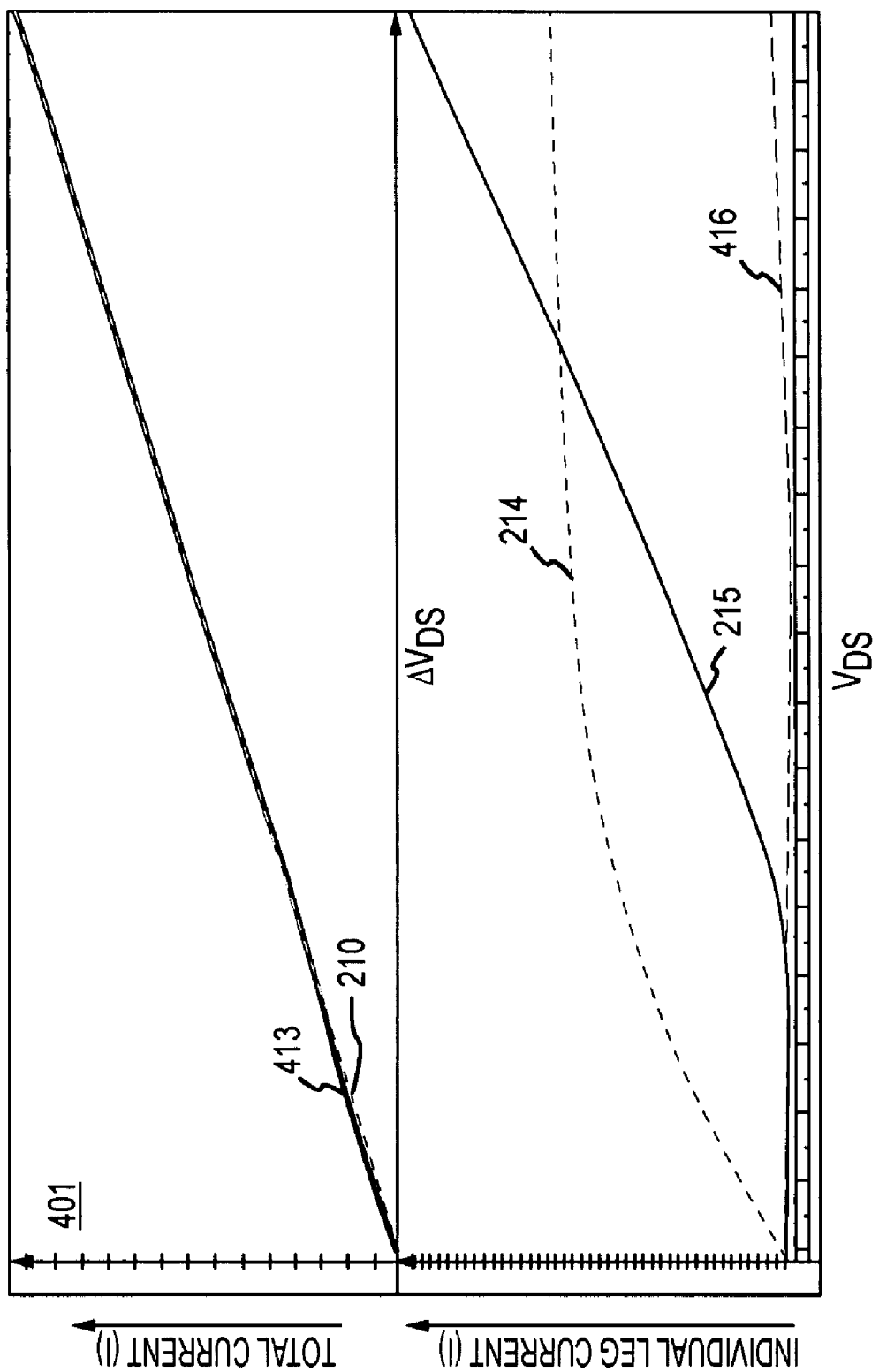
FIG. 4 is a signal diagram of various current signals of the output driver circuit of FIG. 3.

FIG. 4 is a signal diagram 401 of various current signals illustrating the operation of one portion, the pull-down circuit 312, of the output driver circuit 300 of FIG. 3. It will be appreciated that although FIG. 4 is described with respect to the pull-down circuit 312 of the output driver circuit 300, embodiments of the present invention can be also used for the pull-up circuit 311 as well, where applicable, without departing from the scope of the present invention. Those ordinarily skilled in the art will obtain sufficient understanding from the description provided herein to make such modifications as needed to practice embodiments of the present invention as applied to the pull-up circuit 312. Similar to FIG. 2, FIG. 4 includes the graph 210 of the ideal total current signal 210 having a linear response as the drain-to-source voltage changes, assuming the output driver circuit 300 maintains an ideal constant output impedance. A graph 413 of the total current is also shown relative to the graph 210 of the ideal current across $\Delta V_{DS}$ illustrating the operation of the output driver circuit 300 as the total current drawn from the node 350 increases. FIG. 4 shows, in the lower half, the graph 214 of the first leg current as the transistor 32 in the first leg 364 begins to saturate at the lowest voltage $V_{DS}$. However, as the transistor 32 begins to saturate, the current begins to flow in the second leg 365 as shown by the graph 215 since the diode-connected transistor 34 compensates for the saturating current in the transistor 32 to maintain a linear change in current across $\Delta V_{DS}$ as shown by the linear response of the graph 413 of the total current in the upper part of FIG. 4. Graph 416 in the lower part of FIG. 4 shows the current through the third leg 369 increasing to maintain a linear response of the total current, as shown by the graph 413. Therefore, in contrast to the output driver circuit 10 whose operation is described with respect to FIG. 2, the output impedance of the output driver circuit 300 is held substantially constant at the higher drain-to-source voltages.

Figure 5:
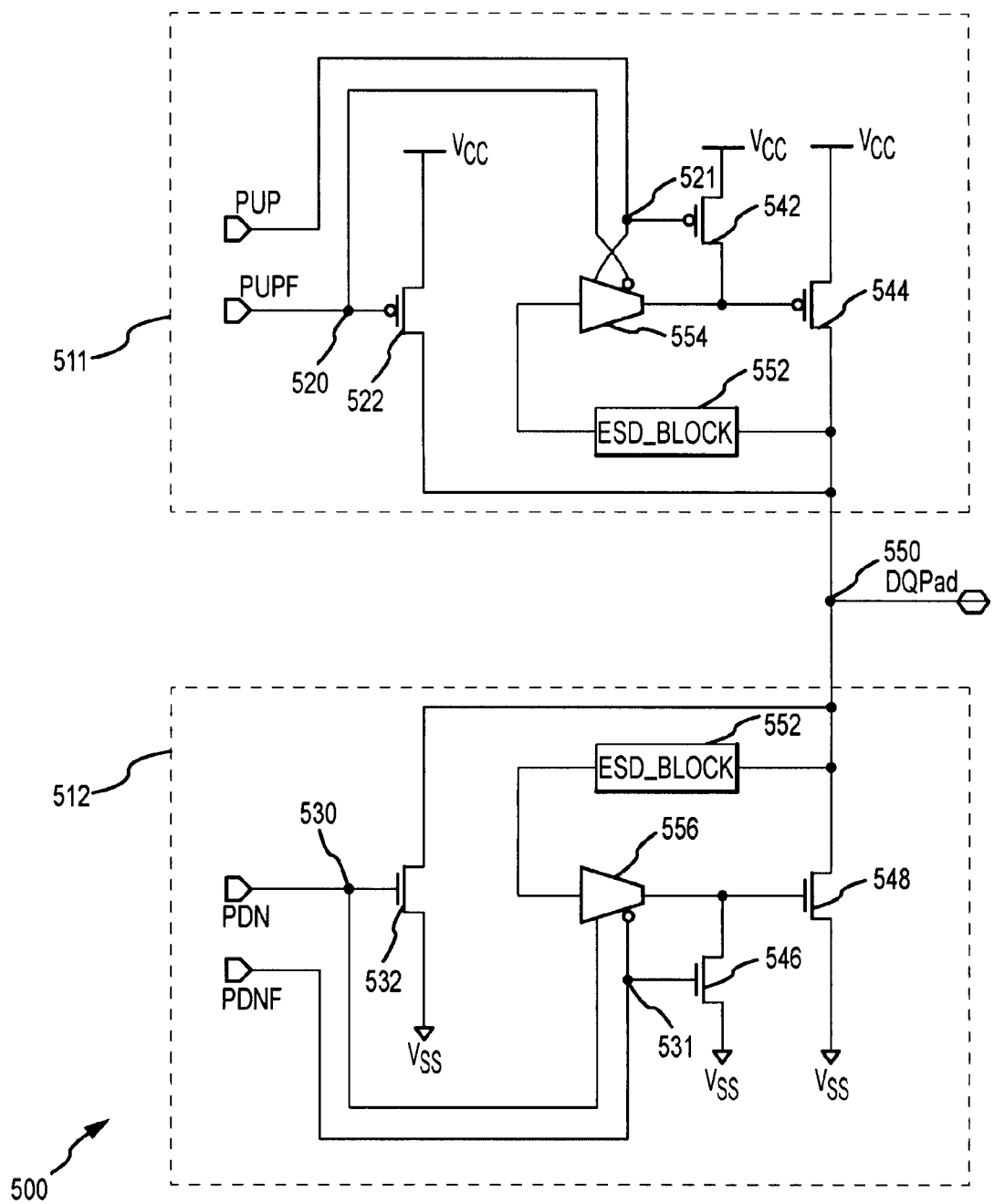
FIG. 5 is a schematic diagram showing a linear output driver according to another embodiment of the invention.

FIG. 5 is a schematic diagram of a linear output driver circuit 500 according to another embodiment of the invention. Similar to the output driver circuit 10 of FIG. 1, the output driver circuit 500 includes a pull-up circuit 511 and a pull-down circuit 512 coupled in series between $V_{CC}$ and $V_{SS}$, and also coupled to an output node 550 having a DQ pad for outputting a DQ signal. Similar to the output driver circuit 10, the output driver circuit 500 may receive a single input signal (both high or both low) or tristate inputs (high/low), where the high/low condition simultaneously places both circuits 511, 512 in a disabled state. However, contrary to the output driver circuit 10, the input to the output driver circuit 500 includes a complementary pair of signals at each input of the pull-up and pull-down circuits 511, 512, which may be generated by inverters, logic circuits or by any means known in the art. It will be appreciated that the complementary pair of signals may be phased slightly apart with respect to each other as is known in the art, instead of being purely complementary, to compensate for delays that may occur due to some components in the output dirver circuit 500, such as block 552 and transfer gates 554, 556, which will be further described in detail. Therefore, the pull-up circuit 511 receiving an input signal PUPF at an input node 520 receives a complementary input signal PUP at an input node 521. An output PMOS transistor 522 receives the PUPF signal at its gate coupled to the node 520, and a disabling PMOS transistor 542 receives the PUP signal at its gate coupled to the node 521. The PUP and PUPF signals are additionally provided to the transfer gate 554, which is controlled by the PUP and PUPF signals. The transfer gate 554 allows a signal received at a third input to pass through to a second transistor 544 when a low PUPF signal and a high PUP signal are received. When the transfer gate 554 becomes conductive, the transistor 544 becomes diode-connected since the third input of the transfer gate 554 is coupled to receive the DQ voltage at the node 550. Some fabrication processes and/or transistors used for the transfer gate 554 may require additional ESD protection as shown by the block 552 but in other cases it can be eliminated and replaced by a simple wire between its terminals.

The pull-down circuit 512 is configured similarly to the pull-up circuit 511, except the transistors in the pull-down circuit 512 comprise NMOS transistors 532, 546, 548 whose sources are coupled to $V_{SS}$ instead of $V_{CC}$. The pull-down circuit 512 is enabled to receive complementary input signals PDN and PDNF. Similar to the pull-up circuit 511, the pull-down circuit 512 includes the transfer gate 556 controlled by the PDN and PDNF signals. When the PDN signal is high and the PDNF signal is low, the transfer gate 556 allows a signal, received by a third input, to pass through to the gate of an NMOS transistor 548. The third input to the transfer gate 556 is coupled to the DQ pad through another ESD protection block 552. As a result, when the transfer gate 556 is enabled, the NMOS transistor 548 functions as a diode-connected transistor.

The output driver circuit 500 operates similarly to the output driver circuit 10 of FIG. 1. In contrast, however, the transfer gates 554, 556 replace the large enabling transistors 26, 36 to reduce the overall size of the output driver circuit 500. In operation, when the PUPF signal is low, the transistor 522 is turned ON, and the PUP signal is high thereby disabling the transistor 542. By turning ON the transistor 522, the output node 550 is pulled towards $V_{CC}$ through the transistor 522. The PUP and PUPF signals additionally enable the transfer gate 554 to allow the DQ voltage to pass through to the gate of the transistor 544. Assuming the voltage at the DQ pad is initially low, the transistor 544 is thus turned ON to also pull the DQ pad towards $V_{CC}$, operating similarly to diode-connected transistor 24 of FIG. 1. The DQ pad is, therefore, pulled towards $V_{CC}$ through both the transistors 522 and 544 until it reaches a voltage level that is greater than $V_{CC}$ less the threshold voltage of the diode-connected transistor 544.

When the PUPF signal is low, the PDN signal is normally low and the PDNF signal is normally high. The transfer gate 556 is then disabled, and the high PDNF signal turns the transistor 546 ON to ensure the transistor 548 is completely disabled. The low PDN signal turns OFF the transistor 532, and therefore the pull-down circuit 512 is deactivated while the pull-up circuit 511 is in operation.

The pull-up circuit 511 operates in a manner that is similar to the operation of the pull-down circuit 512. When the signal PUPF transitions high and the signal PUP transitions low, the transfer gate 554 is disabled and the transistor 522 is turned OFF. The low PUP signal also turns ON the disabling transistor 542 to ensure the transistor 544 remains completely disabled. Therefore, the pull-up circuit 511 is completely disabled while the pull-down circuit 512 is in operation.

When the PDN signal transitions high and the PDNF signal transitions low, the transistor 532 is turned ON to couple the output node 550 to $V_{SS}$ through the transistor 532. Additionally, the disabling transistor 546 is turned OFF, and the transfer gate 556 is enabled. Since the pull-up circuit 511 has initially made the DQ voltage at the output node 550 high, the DQ voltage is passed through the transfer gate 556 and applied to the gate of the transistor 548 to turn ON the transistor 548. Thus, the DQ pad is pulled toward $V_{SS}$ through the second transistor 548. The DQ pad is pulled down to the threshold voltage of the diode-connected transistor 548, at which point the transistor 548 is turned OFF. The DQ pad is thereafter pulled down to $V_{SS}$ solely through the transistor 532. The operations of the pull-up circuit 511 and the pull-down circuit 512 are repeated as the signals PUP/PUPF and PDN/PDNF transition between high and low input levels.

In summary, the overall size of the output driver circuit 500 is reduced by replacing the larger enabling transistors 26, 36 with simple circuits such as the transfer gates 554, 556 that have much smaller components. However, the driver circuit 500 has a similar problem with linearity at higher voltages as the driver circuit 10 of FIG. 1. Although the diode-connected transistors 544, 548 provide some additional current to compensate for saturated currents at the higher voltages, for example through the transistor 522, 532, the current levels are insufficient at much higher voltages, causing the output impedance of the output driver circuit 500 at the node 550 to deviate from a desired constant impedance.

Figure 6:
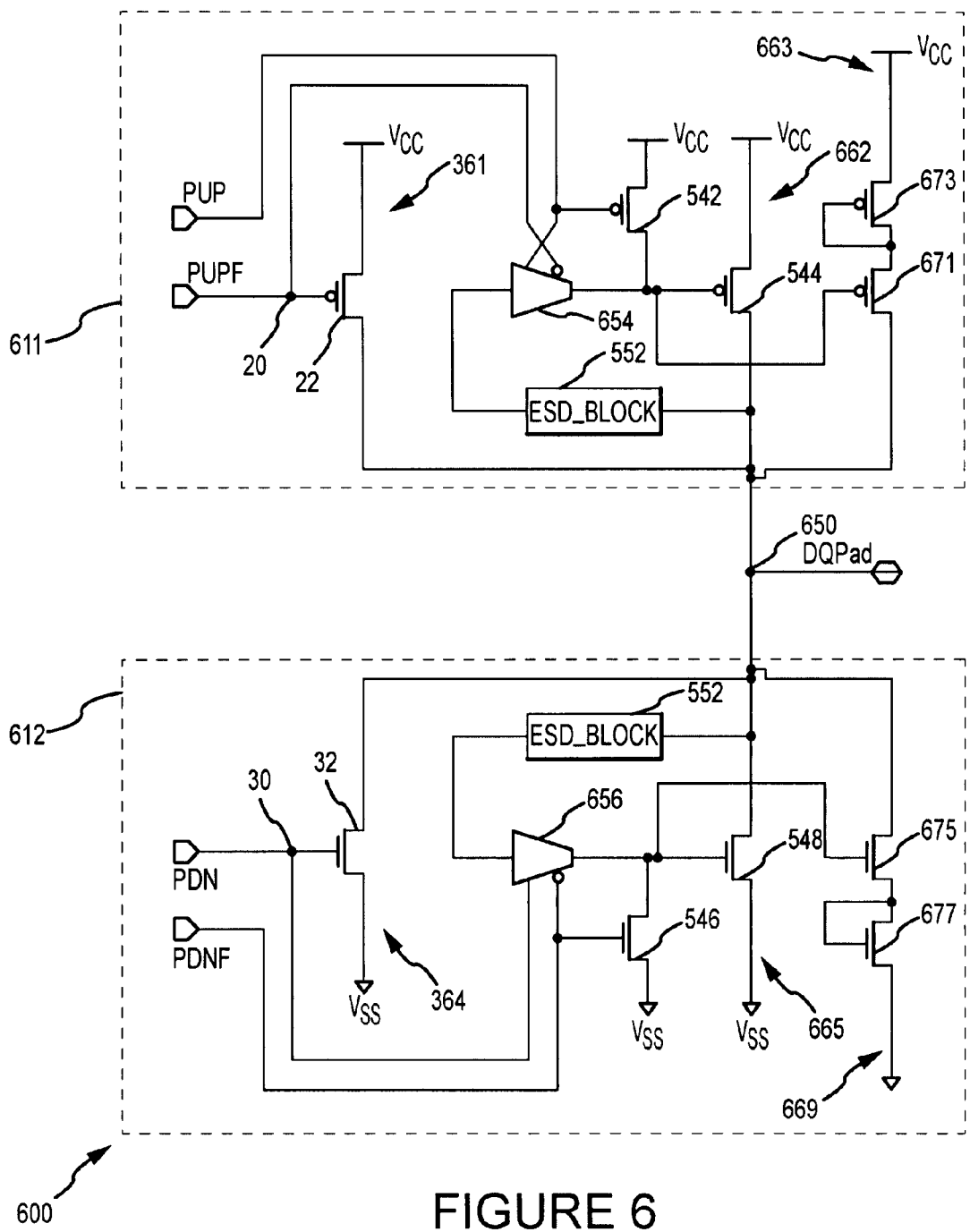
FIG. 6 is a schematic diagram showing a linear output driver according to another embodiment of the invention.

FIG. 6 shows an output driver circuit 600 that optimizes the combined features of FIGS. 3 and 5 to reduce the size of the output driver circuit 600 while still improving its linearity across a wider range of voltages. The output driver circuit 600 includes many of the same components as previously described with reference to the output driver circuits 300, 500, and are referenced by the same reference numerals where appropriate. In the interest of brevity, an explanation of their structure and operation will not be repeated. Similar to the pull-up circuit 311 of the driver circuit 300, a pull-up circuit 611 of the output driver circuit 600 includes three transistor legs 361, 662, 663. In contrast to the driver circuits 300, 500, activation of both the second and third transistor legs 662, 663 are instead controlled by a transfer gate 654. The transfer gate 654, when enabled, applies the DQ voltage at an output node 650 to the gate of both the transistor 544 and transistor 671 of the third leg 663. Similar to the third transistor leg 363 in FIG. 3, the transistor 671 in the third leg 663 is coupled in series to a PMOS diode-connected transistor 673 whose source is coupled to $V_{CC}$. Therefore, the DQ voltage at the node 650 may be pulled towards $V_{CC}$ through all three transistor legs 361, 662, 663 in a manner similar to the three transistor legs 363, 362, 361 of the pull-up circuit 311 in FIG. 3. Those ordinarily skilled in the art will appreciate that the number of transistor legs or the number of transfer gates, or the replacement of components having similar functionality, in the output driver circuit 600 are details that can be modified without departing from the scope of the embodiments of the present invention.

A pull-down circuit 612 is structured similarly to the pull-up circuit 611, except that the three transistor legs 364, 665, 669 include NMOS transistors in place of PMOS transistors. Transistors 548, 675 in the second and third transistor legs 665, 669, respectively, are controlled by the transfer gate 656 that applies the DQ voltage to their gates when the transfer gate 656 is enabled. The transistor 675 is coupled in series to a diode-connected transistor 677 whose source is coupled to $V_{SS}$. The transistor legs 364, 665, 669 pull the DQ pad towards $V_{SS}$ similarly to the transistor legs 364, 365, 369 of the pull-down circuit 312 in FIG. 3.

When the transfer gate 654 of the pull-up circuit 611 is enabled, the DQ pad whose voltage is initially low turns on the transistors 544, 671. Consequently, the diode-connected transistor is enabled to couple the output node 650 to $V_{CC}$ through the third leg 663 in a similar manner described for the third transistor leg 363 of FIG. 3. Similarly, when the transfer gate 656 of the pull-down circuit 612 is enabled and the DQ pad is high, the third leg 669 is activated by enabling the transistors 675, 677 in the same manner as activating the transistor leg 369 of FIG. 3. In contrast to FIG. 3, however, the large enabling transistors 26, 36, 328, 338 are omitted in the output driver circuit 600, thereby significantly reducing its size. However, in contrast to the output driver circuit 500 of FIG. 5, greater linearity is achieved at much higher voltages by the addition of more current by the third transistor legs 663, 669 in a manner that is comparable to the output driver circuit 300 of FIG. 3. Therefore, linearity over a wider range of voltages may be achieved by the output driver circuit 600 while its overall size is reduced.

Figure 7:
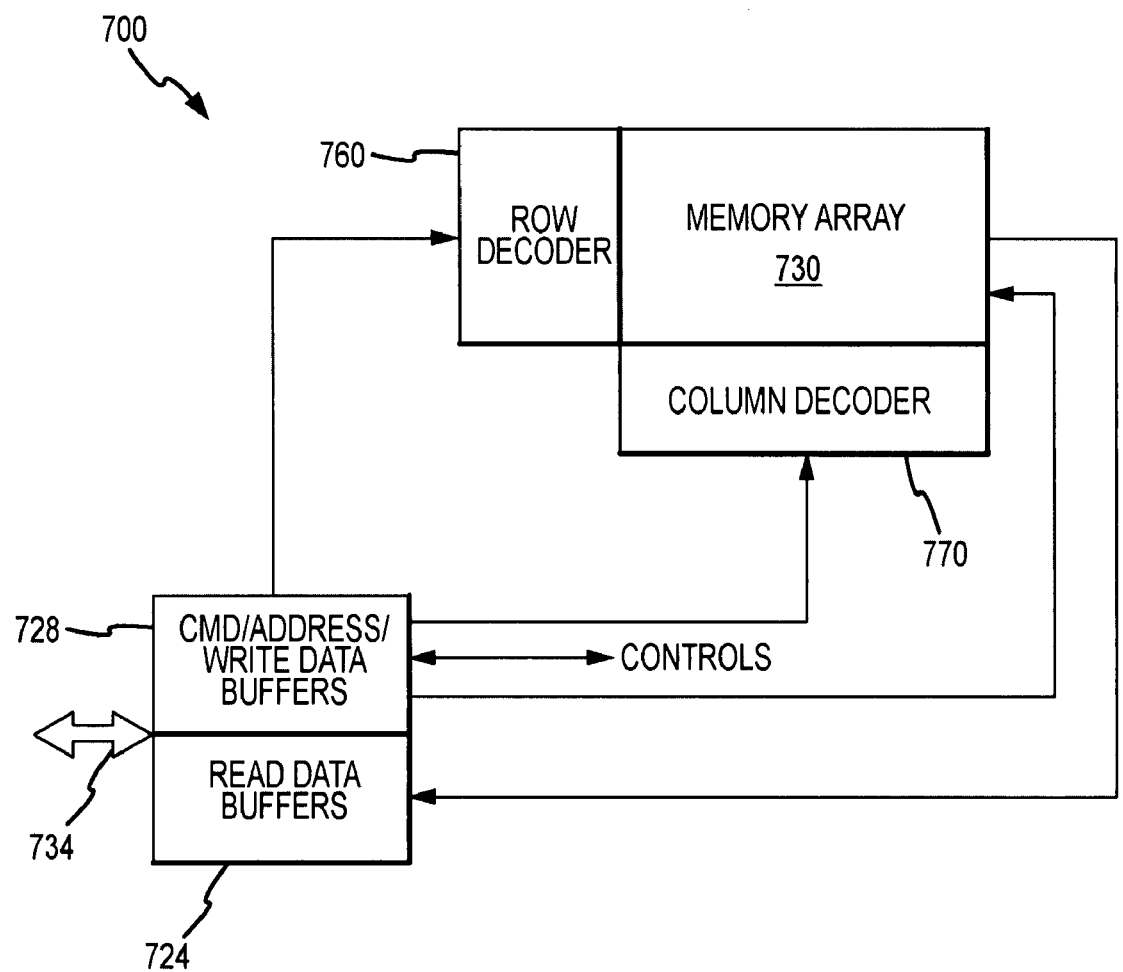
FIG. 7 is a block diagram showing a memory device having a linear output driver according embodiments of the invention.

FIG. 7 is a functional block diagram of a memory device 700 having drivers that include the output driver circuits in accordance with the embodiments previously described. The memory device 700 in FIG. 7 includes a synchronous dynamic random access memory ("SDRAM") or a reduced latency dynamic random access memory (RLDRAM), although the principles described herein are applicable to any memory device that may include output driver circuits 300, 500, 600.

The memory device 700 includes a memory array 730 of memory cells arranged in rows and columns. The memory array 730 may be accessed on a row-by-row, page-by-page or bank-by-bank basis as will be appreciated by one skilled in the art. The memory array 730 further includes a command, address and write data buffer block 728 that may receive row, column, and memory address signals over a bus 734 from some processing component (not shown) or controller (not shown), such as a memory controller. Similarly, read data signals may be received by read data buffers 724 to output read data from the memory array 730 through the bus 734. The block 728 may apply row address signals to a row decoder 760 and column address signals to a column decoder 770. The row decoder 760 activates a row of cells in the memory array 730 corresponding to decoded row address signals. Similarly, the column decoder 770 enables write data signals to be applied to selected columns corresponding to the column address signals and allows read data signals to be coupled from selected columns corresponding to the column address signals during memory read operation. The block 728 may additionally provide control and timing signals to various components of the memory device 700 for a number of performance operations. The detailed operation for generating control and timing signals is conventional, and thus, for the sake of brevity, will not be described in more detail.

The read data buffers 724 may include the smaller-sized output drivers 600, 500, 300 according to embodiments previously described or according to another embodiment of the invention. The output drivers are therefore capable of providing a substantially constant impedance across a wider range of voltages.

Figure 8:
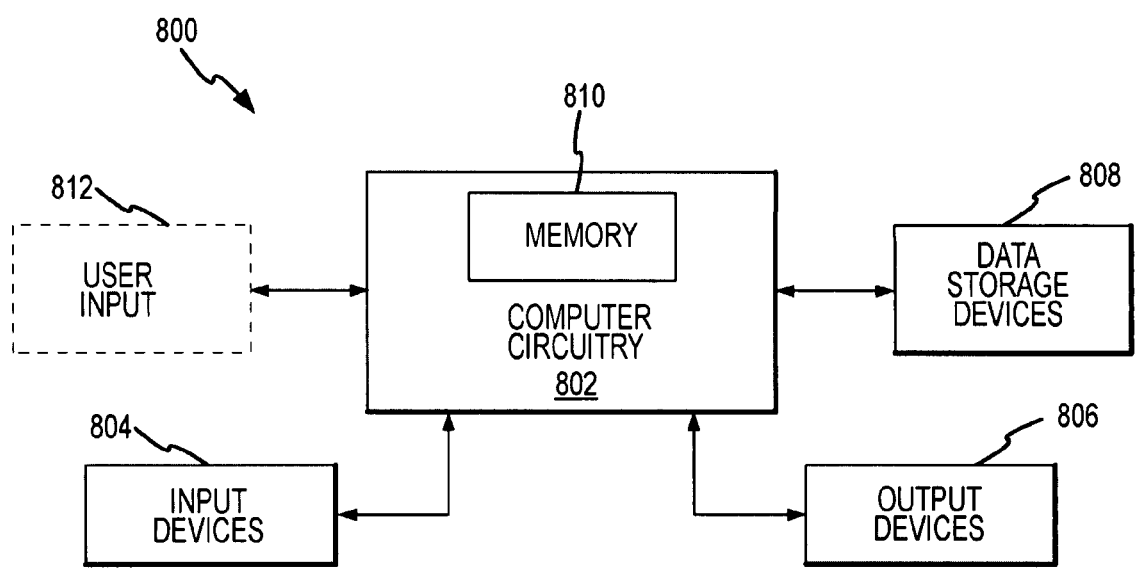
FIG. 8 is a circuit diagram of a processor-based system that includes the memory device of FIG. 5 according to embodiments of the invention.

FIG. 8 is a circuit diagram of an embodiment of a processor-based system 800 that includes the memory device 700 of FIG. 7. Conventionally, the processor circuitry 802 is coupled through address, data, and control buses to a memory device 810 to provide for writing data to and reading data from the memory device 810. The processor circuitry 802 includes circuitry for performing various processor functions, such as executing specific software to perform specific calculations or tasks. In addition, the processor-based system 800 may include one or more input devices 804, such as a keyboard or a mouse, coupled to the processor circuitry 802 to allow a user to interface with the processor-based system 800. Conventionally, the processor-based system 800 may also include one or more output devices 806 coupled to the processor circuitry 802, such as output devices conventionally including a printer and a video terminal. One or more data storage devices 808 are also conventionally coupled to the processor-based circuitry 802 to store data or retrieve data from external storage media (not shown). Examples of conventional storage devices 808 include hard and floppy disks, tape cassettes, compact disk read-only ("CD-ROMs") and compact disk read-write ("CD-RW") memories, and digital video disks ("DVDs"). Data storage devices 808 may also include non-volatile memory devices to store data that is to be retained even when power is not supplied to the processor-based system 800 or the data storage devices 808, such as a flash memory device (not shown) according to some other examples of the invention.

FIG. 8 may, for example, be a consumer device, such as a cell phone, digital camera or other hand-held device, having a user input 812 coupled to the processor 802. The processor 802 may be a microprocessor, digital signal processor, or part of a central processing unit that communicates with the user input 812 over a bus. The processor 802 may additionally have a random access memory (RAM) or, alternatively, the user input 812 may include the RAM to which the processor communicates over the bus. The user input 812 may additionally include a non-volatile storage device such as flash memory, or rely on the data storage device 808.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An output driver circuit, comprising:
an output node; and
a first plurality of transistors configured to couple the output node to a first voltage, the first plurality of transistors comprising:
a first current path configurable to couple the first voltage to the output node, the first current path including a first transistor;
a second current path configurable to couple the first voltage to the output node and operable to drive the output node towards the first voltage after the first transistor substantially enters into saturation, the second current path including at least a second transistor; and
a third current path configurable to couple the first voltage to the output node and operable to drive the output node towards the first voltage when the first and at least the second transistors are substantially in saturation.

2. The output driver circuit of claim 1 further comprising a second plurality of transistors configured to couple the output node to a second voltage, the second plurality of transistors comprising:
a fourth current path configurable to couple the output node to the second voltage, the fourth current path including a fourth transistor;
a fifth current path configurable to couple the output node to the second voltage and operable to drive the output node towards the second voltage after the fourth transistor substantially enters into saturation, the fifth current path including a fifth transistor; and
a sixth current path configurable to couple the output node to the second voltage and operable to drive the output node towards the second voltage when the fourth and fifth transistors are substantially in saturation.

3. The output driver of claim 2 further comprising:
an input node configured to receive a first input signal for enabling the first plurality of transistors and a second input signal for enabling the second plurality of transistors.

4. The output driver of claim 2 wherein:
the first and fourth current paths comprise an output transistor;
the second and fifth current paths each comprise an enabling transistor coupled to a diode-connected transistor; and
the third and sixth current paths each comprise an enabling transistor coupled to cascode diode-connected transistors.

5. An output driver, comprising:
a first voltage source;
a second voltage source;
an output node configured to provide an output signal;
a pull-up circuit having a first transistor coupled between the first voltage source and the output node, the pull-up circuit operable in a first mode to couple the output node to the gate of the first transistor through a first transfer gate to form a diode-connected transistor between the first voltage source and the output node, and operable in a second mode to inhibit the operation of the first transistor between the first voltage source and the output node through the first transfer gate; and a pull-down circuit coupled in series with the pull-up circuit, the pull-down circuit having a second transistor coupled between the output node and the second voltage source, the pull-down circuit operable in a third mode to couple the output node to the gate of the second transistor through a second transfer gate to form a diode-connected transistor between the output node and the second voltage source, and operable in a second mode to inhibit the operation of the second transistor between the output node and the second voltage source through the second transfer gate.

6. The output driver of claim 5 wherein:
the pull-up circuit comprises a first input node configured to receive a pair of complimentary input signals from a first logic circuit; and
the pull-down circuit comprises a second input node configured to receive a pair of complimentary inputs signals from a second logic circuit.

7. The output driver of claim 6 wherein the first and second transfer gates each comprise first and second input nodes coupled to receive a complementary pair of input signals from the respective first and second input nodes and a third input node coupled to the output node, each of the transfer gates operable to provide the output signal to enable the first and second transistors, respectively, in response to receiving the complementary pair of input signals.

8. The output driver of claim 5 wherein the operation of the first and second transistors are each respectively inhibited by a disabling transistor activated when the first and second transfer gates are disabled.

9. The output driver of claim 5 wherein the third input of each of the first and second transfer gates are coupled to the output node through an electrostatic discharge circuit to discharge electrostatic charge.

10. An output driver, comprising:
a first voltage source;
an output node having an output voltage;
a current source coupled to the first voltage source and to the output node, the current source operable to source a first current to the output node; and
a first diode circuit and a second diode circuit each coupled to the first voltage source and to the output node, the first and second diode circuits further coupled in parallel to the current source and to each other through a first transfer gate, the first and second diode circuits operable to source a second current through the first diode circuit and a third current through the second diode circuit to provide to the output node a total current whose magnitude changes linearly as the magnitude of the output voltage is driven towards the voltage of the first voltage source.

11. The output driver of claim 10 further comprising:
a second voltage source;
a current sink coupled to the output node and the second voltage source, the current sink operable to sink a first current from the output node to the second voltage source; and
a third diode circuit and a fourth diode circuit each coupled to the output node and the second voltage source, the third and fourth diode circuits further coupled in parallel to the current sink and to each other through a second transfer gate, the third and fourth diode circuits operable to sink a second current through the third diode and a third current through the fourth diode circuit and sink to the second voltage source to provide a total current whose magnitude changes linearly as the magnitude of the output voltage is driven towards the second voltage source.

12. The output driver of claim 11 wherein:
the current source comprises a first PMOS transistor;
the first diode circuit comprises a second PMOS transistor having its drain coupled to its gate through the transfer gate; and
the second diode circuit comprises a third PMOS transistor having its drain coupled to its gate through the transfer gate and coupled in series to a diode-connected PMOS transistor.

13. The output driver of claim 12 wherein:
the current sink comprises a first NMOS transistor;
the third diode circuit comprises a second NMOS transistor having its drain coupled to its gate through the transfer gate; and
the fourth diode circuit comprises a third NMOS transistor having its drain coupled to its gate through the transfer gate and coupled in series to a diode-connected NMOS transistor.

14. The output driver of claim 11 wherein each of the first and second transfer gates are respectively coupled to a disabling transistor that is activated when the first and second transfer gates are disabled, and the disabling transistor is operable to disable the respective diode circuits.

15. The output driver of claim 11 wherein each of the first and second transfer gates are coupled to the output node through an electrostatic discharge circuit to discharge electrostatic charge.

16. A memory device, comprising:
an address bus;
a control bus;
a data bus;
an address decoder coupled to the address bus;
a read/write circuit coupled to the control bus;
an array of memory cells coupled to the address decoder, control bus, and read/write bus; and
an output driver circuit for outputting data read from the array of memory cells, the output driver circuit comprising:
a first voltage source providing a first logic level;
an output node having a data signal; and
a pull-up circuit coupling the first voltage source to the output node, the pull-up circuit comprising:
a first current path coupling the first voltage and the output node through a first transistor, the first current path operable to drive the data signal towards the first logic level;
a second current path coupling the first voltage and the output node through a second transistor, the second current path being in parallel to the first current path, the second current path operable to drive the data signal towards the first logic level as the first transistor of the first current path substantially enters into saturation; and
a third current path coupled to the first voltage and the output node through a third transistor, the third current path being in parallel to the first and second current path, the third current path operable to drive the data signal towards the first logic level as the first and second transistors are substantially in saturation.

17. The memory device of claim 16 further comprising:
a second voltage source providing a second logic level; and
a pull-down circuit coupling the output node to the second voltage source, the pull-down circuit comprising:
a fourth current path coupled to the output node and the second voltage source, the fourth current path operable to drive the data signal towards the second logic level, the fourth current path including a fourth transistor;

a fifth current path coupled to the output node and the second voltage source and coupled in parallel to the fourth current path, the fifth current path operable to drive the data signal towards the second logic level as the fourth transistor substantially enters into saturation; and a sixth current path coupled to the output node and the second voltage source and coupled in parallel to the fourth and fifth current path, the sixth current path operable to drive the data signal towards the second logic level when the fourth and fifth transistors are substantially in saturation.

18. The memory device of claim 17 wherein:

the first and fourth current paths comprise an output transistor;

the second and fifth current paths each comprise an enabling transistor coupled to a diode-connected transistor; and the third and sixth current paths each comprise an enabling transistor coupled to a cascode diode-connected transistors.

19. A processor-based system comprising:

a data input device;

a data output device;

a plurality of buses to and from the data input, output and storage devices;

processor circuitry coupled to the data input, output and storage devices, the processor circuitry operable to process data to and from the data input and output devices on the plurality of buses; and at least one memory device having an array of memory cells arranged in rows and columns, the array of memory cells comprising:

an address bus;

a control bus;

a data bus;

an address decoder coupled to the address bus;

a read/write circuit coupled to the control bus;

an array of memory cells coupled to the address decoder, control bus, and read/write bus; and an output driver circuit for outputting data read from the array of memory cells, the output driver circuit comprising:

an output node coupled to the data bus; and a first plurality of transistors coupled in series with a second plurality of transistors and coupled to the output node, each of the first and second plurality of transistors comprising:

a first output transistor coupled to a voltage source and to the output node, the output transistor operable to provide a first current to the output node; and a first diode circuit and a second diode circuit each coupled to the voltage source and to the output node, and coupled in parallel to the first output transistor and to each other through a transfer gate, the first and second diode circuits operable to provide a second current through the first diode circuit and a third current through the second diode circuit responsive to the transfer gate being enabled to provide to the output node a total current whose magnitude changes linearly as the magnitude of the output voltage is driven towards the voltage source.

20. A method of driving an output signal at an output node, the method comprising:

providing a first current having a magnitude that initially changes linearly and then changes non-linearly;

providing a second current that is added to the first current, the second current having a magnitude that begins to change linearly as the first current begins to change non-linearly and then changes non-linearly; and providing a third current that is added to the first and second current, the third current having a magnitude that begins to change linearly as the second begins to change non-linearly.

21. The method of claim 20 wherein:

providing the second current comprises providing a second current having a magnitude that changes linearly responsive to the output voltage reaching a first predetermined voltage level; and providing the third current comprises providing a third current having a magnitude that changes linearly responsive to the output voltage reaching a second predetermined voltage level.

22. The method of claim 21 wherein providing the second and third currents comprises providing the second and third currents through a diode circuit enabled by a transfer gate.

23. A method of driving an output node to an output voltage in an output driver, comprising:

providing a first current through a first current path;

in a first mode, providing a second current through a second current path when the output voltage has increased to a predetermined voltage so that the sum of the first and second currents has a total magnitude that changes linearly as the magnitude of the output voltage changes; and in a second mode, inhibiting the second current through the second current path to disable the operation of driving the output node to the output voltage.

24. The method of claim 23 wherein providing the second and third currents in the first mode and inhibiting the second and third currents in the second mode are controlled by a transfer gate.

* * * * *